United States Patent
Kubota et al.

[11] Patent Number: 5,976,481
[45] Date of Patent: Nov. 2, 1999

[54] POLYCRYSTAL SILICON ROD AND PRODUCTION PROCESS THEREFOR

[75] Inventors: Junichi Kubota; Hiroyuki Oda, both of Tokuyama, Japan

[73] Assignee: Tokuyama Corporation, Yamaguchi, Japan

[21] Appl. No.: 09/000,033

[22] PCT Filed: May 19, 1997

[86] PCT No.: PCT/JP97/01674

§ 371 Date: Jan. 20, 1998

§ 102(e) Date: Jan. 20, 1998

[87] PCT Pub. No.: WO97/44277

PCT Pub. Date: Nov. 27, 1997

[30] Foreign Application Priority Data

May 21, 1996 [JP] Japan ................................... 8-125313

[51] Int. Cl.[6] ............................ C01B 33/02; C30B 29/06
[52] U.S. Cl. ........................... 423/348; 423/349; 423/350
[58] Field of Search ................................... 423/348, 349, 423/350

[56] References Cited

U.S. PATENT DOCUMENTS

| | | | |
|---|---|---|---|
| 3,438,810 | 4/1969 | Benedict et al. | 423/348 |
| 4,292,342 | 9/1981 | Sarma et al. | 423/350 |
| 4,526,769 | 7/1985 | Ingle et al. | 423/350 |
| 4,734,297 | 3/1988 | Jacubert et al. | 423/349 |
| 4,744,863 | 5/1988 | Guckel et al. | 438/53 |
| 4,921,026 | 5/1990 | Flagella et al. | 148/33 |
| 5,310,531 | 5/1994 | Ikeda et al. | 423/348 |
| 5,336,335 | 8/1994 | Hall et al. | 136/258 |
| 5,382,419 | 1/1995 | Nagai et al. | 423/348 |
| 5,478,396 | 12/1995 | Keck et al. | 118/719 |

FOREIGN PATENT DOCUMENTS

| | | |
|---|---|---|
| 7-277874 | 10/1995 | Japan . |
| 8-67510 | 3/1996 | Japan . |
| 8-169797 | 7/1996 | Japan . |

OTHER PUBLICATIONS

Translation of JP 08–067,510, Mar. 1996.
Translation of JP 7–277,874, Oct. 1995.

Primary Examiner—Ngoc-Yen Nguyen
Attorney, Agent, or Firm—Birch, Stewart, Kolasch & Birch, LLP

[57] ABSTRACT

A polycrystal silicon rod characterized in that it has a half value width of a peak indicative of crystal orientation (111) of an X-ray diffraction pattern, of 0.3° or less, an internal strain rate in a radial direction of less than $5.0 \times 10^{-5}$ cm$^{-1}$ and an internal iron concentration of 0.5 ppba or less. The above polycrystal silicon rod having high crystallinity, high purity and low internal strain is produced by heating a core material in a gaseous atmosphere comprising trichlorosilane and hydrogen to deposit silicon on the silicon core material to produce a polycrystal silicon rod, and subjecting the polycrystal silicon rod to a heat treatment without allowing it to contact with the air, to remove strain contained therein.

3 Claims, 3 Drawing Sheets

POLYCRYSTAL SILICON ROD AND PRODUCTION PROCESS THEREFOR

This application is the national phase under 35 U.S.C. §371 of prior PCT International Application No. PCT/JP97/01674 which has an International filing date of May 19, 1997 which designated the United States of America, now WO97/44277.

FIELD OF TECHNOLOGY

This invention relates to a polycrystal silicon rod having small internal strain and uniform high-crystallinity, and a production process therefor. More specifically, it relates to a high-purity polycrystal silicon rod whose residual strain is reduced to such an extent that trouble caused by cracking can be prevented even when it is fed directly into a melting furnace in the production of silicon single crystals to be used for the production of devices and the like by recharging and yet which has stable melt properties; and a process for the production thereof.

BACKGROUND OF TECHNOLOGY

A polycrystal silicon rod is generally produced by a chemical vapor deposition (to be abbreviated as CVD hereinafter). That is, the CVD is generally carried out by bringing hydrogen and one member of silane gases such as monosilane, dichlorosilane, trichlorosilane and the like or a mixture of two or more of these gases into contact with a core material kept at a high temperature, in a gaseous atmosphere diluted with an inert gas as required, to deposit silicon on the surface of the core material. Out of methods for depositing polycrystal silicon by the CVD method, there is a method for producing a polycrystal silicon rod by using silicon as a core material and thickening the rod, in particular. This method is also called a Siemens method, and is generally and widely employed.

Meanwhile, an attempt is made to melt a polycrystal silicon rod produced by the above Siemens method, as it is, and convert it into single crystals by recharging. Japanese Laid-Open Patent Publication 7-277874 teaches a technology for producing single crystal silicon by supplying the silicon rod directly as a rod for recharging.

This Laid-open Publication discloses the necessity for reducing the residual stress of a polycrystal silicon rod to prevent a fall caused by the cracking of the polycrystal silicon rod as a raw material during the preparation of single crystals. As specific means of reducing the residual stress, there is disclosed a method of producing a polycrystal silicon rod from monosilane as a raw material. This publication teaches also that since a polycrystal silicon rod obtained from raw materials other than monosilane has large residual stress, a heat treatment such as annealing is carried out before melting of the rod to remove the residual stress.

However, a polycrystal silicon rod produced from monosilane as a raw material on an industrial scale generally has low crystallinity. In other words, the polycrystal silicon rod produced from monosilane has a half value width of a peak (may be also referred to as "peak (111)" hereinafter) in the vicinity of 2θ=28.5° of an X-ray diffraction pattern obtained using copper as a target of around 0.4° to 0.50°.

Therefore, the polycrystal silicon rod produced from such monosilane as a raw material has a low crystallinity and in consequence, such trouble is invited that an amorphous portion remains as a hole and an etching solution remains therein when a treatment for obtaining high-purity single crystal silicon, particularly a treatment for etching the surface thereof with a view to prevent inclusion of heavy metals, is carried out.

This can be presumed from Japanese Laid-Open Patent Publication 8-169797 which teaches that fine powders formed through a homogenous reaction are contained in a polycrystal silicon rod produced by the deposition of monosilane.

Japanese Laid-Open Patent Publication 8-67510 discloses that the surface area of the above polycrystal polysilicon having a low crystallinity is increased when it is etched.

In contrast to this, a polycrystal silicon rod produced using trichlorosilane as a raw material has a high crystallinity and does not contain fine powders because it is free from a homogenous reaction.

Therefore, when trichlorosilane is used as a raw material for the production of a polycrystal silicon rod, the resulting polycrystal silicon rod does not deteriorate in quality by etching because it has a smooth surface even after etching. Further, as trichlorosilane is much more inexpensive than monosilane, the use of a polycrystal silicon rod produced from trichlorosilane for recharging has been desired.

However, since a polycrystal silicon rod produced from trichlorosilane as a raw material has large residual stress in the rod, as also disclosed in Japanese Laid-Open Patent Publication 7-277874, it has been considered to be unsuitable for use as a rod for FZ or recharging.

Further, when the polycrystal silicon rod is subjected to a heat treatment such as annealing before melting treatment for the purpose of removing the residual stress of the polycrystal silicon rod, its purity is greatly reduced by contamination and it cannot be used in the production of single crystals any longer.

That is, since the heat treatment of the polycrystal silicon rod before melting is carried out after the polycrystal silicon rod is taken out from a deposition reactor, its surface is contaminated with iron at a concentration of around $1 \times 10^{15}$ atoms/cm$^2$ by its contact with impurities contained in the air during its transfer. This surface contamination spreads into the interior of the rod during heat treatment with the result of a final contamination of about 7 ppba.

Moreover, since this heat treatment is carried out at a temperature of not lower than 1,100° C, there is the possibility that the interior of the rod is contaminated by dopant impurities and heavy metal impurities released from a heater or container.

Even when such contamination on the exterior surface of the polycrystal silicon rod subjected to the above heat treatment is removed by etching in a clean room before melting in order to use it in the production process of single crystal silicon, the rod is never restored to a clean state and exerts a bad influence on the purity of the obtained single crystal silicon.

To prevent the contamination of the polycrystal silicon rod, it is conceivable to protect the rod with a quartz glass tube. However, it cannot be said that this method is effective because the quartz glass is softened at a temperature of not lower than 1,000° C.

DISCLOSURE OF THE INVENTION

It is therefore an object of the present invention to provide a high-purity polycrystal silicon rod having high crystallinity, an extremely small content of impurities typified by iron, and extremely small residual stress.

It is another object of the present invention to provide a process for producing the above polycrystal silicon rod of the present invention industrially advantageously and efficiently.

Other objects and advantages of the present invention will become apparent from the following description.

According to the present invention, firstly, the above objects and advantages of the present invention can be attained by a polycrystal silicon rod having a half value width of a peak indicative of crystal orientation (111) of an X-ray diffraction pattern, of 0.3° or less, an internal strain rate in a radial direction of less than $5.0 \times 10^{-5}$ cm$^{-1}$ and an internal iron concentration of 0.5 ppba or less.

According to the present invention, secondly, the above objects and advantages of the present invention can be attained by a process suitable for obtaining the above polycrystal silicon rod, that is, a process for producing a polycrystal silicon rod, which comprises heating a silicon core material in a gaseous atmosphere consisting of trichlorosilane and hydrogen to deposit silicon on the silicon core material to produce a polycrystal silicon rod and then, subjecting the polycrystal silicon rod to a heat treatment without allowing it to contact with the air, thereby reducing internal strain.

BRIEF EXPLANATION OF THE DRAWINGS

In FIG. 2, reference numeral 1 denotes internal strain and in FIG. 3, reference numeral 2 denotes a temperature distribution curve for the inside of the rod when the surface temperature is 1,150° C., 3 a temperature distribution curve for the inside of the rod one minute after the electric current is shut off instantaneously, and 4 a temperature distribution curve for the inside of the rod five minutes after the applied current is shut off instantaneously.

SPECIFIC DISCLOSURE OF THE INVENTION

Figure 1:
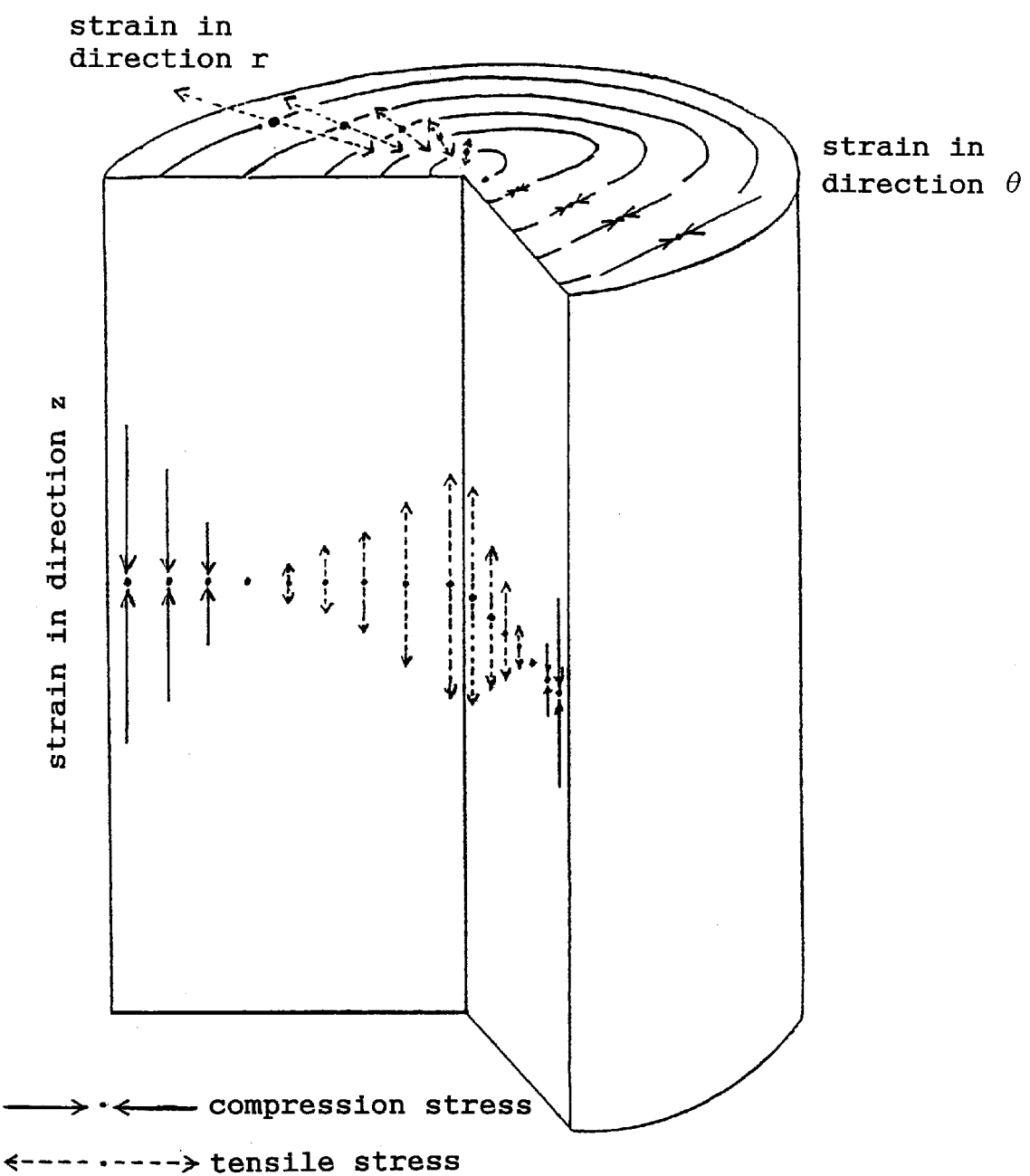
FIG. 1 is a schematic diagram showing strains in directions r, θ and z present in the interior of a deposited polycrystal silicon rod.

The polycrystal silicon rod of the present invention has high crystallinity with a half value width of a peak (2θ= about 28.5°) indicative of crystal orientation (111) of an X-ray diffraction pattern obtained using copper as a target (may be simply referred to as "X-ray diffraction" hereinafter), of 0.3° or less.

In a polycrystal silicon rod having a half value width of a specific peak indicative of crystal orientation (111) of more than 0.3°, many holes are readily formed in the surface by a treatment such as etching due to the presence of amorphous portions, and impurities remain in these holes, thereby reducing the purity of the polycrystal silicon rod. Therefore, such polycrystal silicon rod is not the object which the present invention is directed to.

Since the above-described polycrystal silicon rod produced from monosilane as a raw material contains therein silicon fine powders formed through a homogenous reaction, it has low crystallinity and has generally a half value width of a specific peak indicative of crystallinity of around 0.4 to 0.5°.

Therefore, in the present invention, it is preferred that the half value width of a specific peak indicative of the crystallinity of the above polycrystal silicon is as small as possible within the above range. That is, the half value width of the specific peak of the above X-ray diffraction pattern is 0.2° or less, preferably 0.17° or less, more preferably 0.16° or less.

The polycrystal silicon rod of the present invention has the above high crystallinity and satisfies that an internal strain rate in a radial direction is less than $5.0 \times 10^{-5}$ cm$^{-1}$. That is, to eliminate a trouble such as cracking of rod caused when single crystal silicon is produced using a polycrystal silicon rod directly, it is important that the difference between the maximum strain and the minimum strain per 1 cm in a radial direction is small.

In this connection, a polycrystal silicon rod produced from trichlorosilane as a raw material and deposited by the Siemens method has an internal strain rate of about $1 \times 10^{-4}$ cm$^{-1}$, and some of the polycrystal silicon rods have cracks before being taken out from a deposition reactor. Supposing that a rod having an internal strain rate of about $1 \times 10^{-4}$ cm$^{-1}$ or more releases its strain by cracking, the limit of the critical internal strain rate required for keeping the rod in a not-cracked state is judged to be about $1 \times 10^{-4}$ cm$^{-1}$. By the way, since the rod is subjected to partial melting when single crystal silicon is converted from the polycrystal silicon rod, the rod undergoes thermal impact. Although the rate of strain caused by the thermal impact varies depending on conditions, it is estimated at about $5 \times 10^{-5}$ cm$^{-1}$ in a direction r. It is considered that cracking occurs when the resultant strain rate combining the initial strain rate of the rod and a strain rate added by thermal impact exceeds the above-mentioned $1 \times 10^{-4}$ cm$^{-1}$. Therefore, the internal strain rate of the polycrystal silicon rod of the present invention is less than $5 \times 10^{-5}$ cm$^{-1}$, preferably $3 \times 10^{-5}$ cm$^{-1}$ or less, more preferably $2 \times 10^{-5}$ cm$^{-1}$ or less.

In the present invention, the internal strain rate of the polycrystal silicon rod is measured as follows.

As shown in FIG. 1, the internal strain of a polycrystal silicon rod is resolved into three elements in a direction r (outward direction from the center of the rod at a cross section perpendicular to the longitudinal direction of the rod), a direction θ (circumferential direction perpendicular to a direction r at a cross section perpendicular to the longitudinal direction of the rod) and a direction z (longitudinal direction of the rod) in the cylindrical coordinates.

To measure internal strains in the directions r and θ, the rod is cut in a direction perpendicular to the longitudinal direction of the rod at an arbitrary measurement site and then at another site to fabricate it into a short rod. The length of this short rod is preferably 300 mm or more but 400 mm or less. When the length of the rod is less than 300 mm, the amount of deformation due to cutting is large, thereby making it difficult to measure strain accurately. When the rod is too long, operation becomes difficult. After the rod is cut into a short rod, the measurement surface of the rod is smoothened and then, roughened with a diamond file of about #200 and cleaned. After the cleaned surface is dried, strain gauges are affixed onto the surface in a direction that strains in the directions r and θ can be measured. To eliminate the influence of variation in strains in the orientations of the rod, strain gauges as many as possible are affixed onto straight lines extending toward outward directions from the center of the cross section of the rod. To minimize the measurement error, the interval of the strain gauges is preferably 10 mm or less, more preferably 7 mm or less. By affixing the strain gauges in a variety of directions radially from the center, a strain distribution within the plane can be measured in more detail. Thereafter, the portions affixed with the strain gauges is cut into rectangular parallelepiped having a size of around 7×7×5 mm in the thickness, to release strain. To measure strain in the direction z, the short rod is further cut in a longitudinal direction including the center axis, and the same operation as that for the measurement of strain in the directions r and θ is carried out. In this case, the obtained value is slightly smaller than the original value since the strain is reduced by cutting the rod in a longitudinal direction at the time when it is fabricated into a short rod.

The strain measured by the strain gauges is shown by $\Delta L/(L+\Delta L)$ when the initial length of the distorted material is represented by L and the length of the material after the strain has been removed is represented by L+ΔL. Therefore, the strain value has no unit. A symbol (−) is used for tensile stress and (+) for compression stress.

Figure 2:
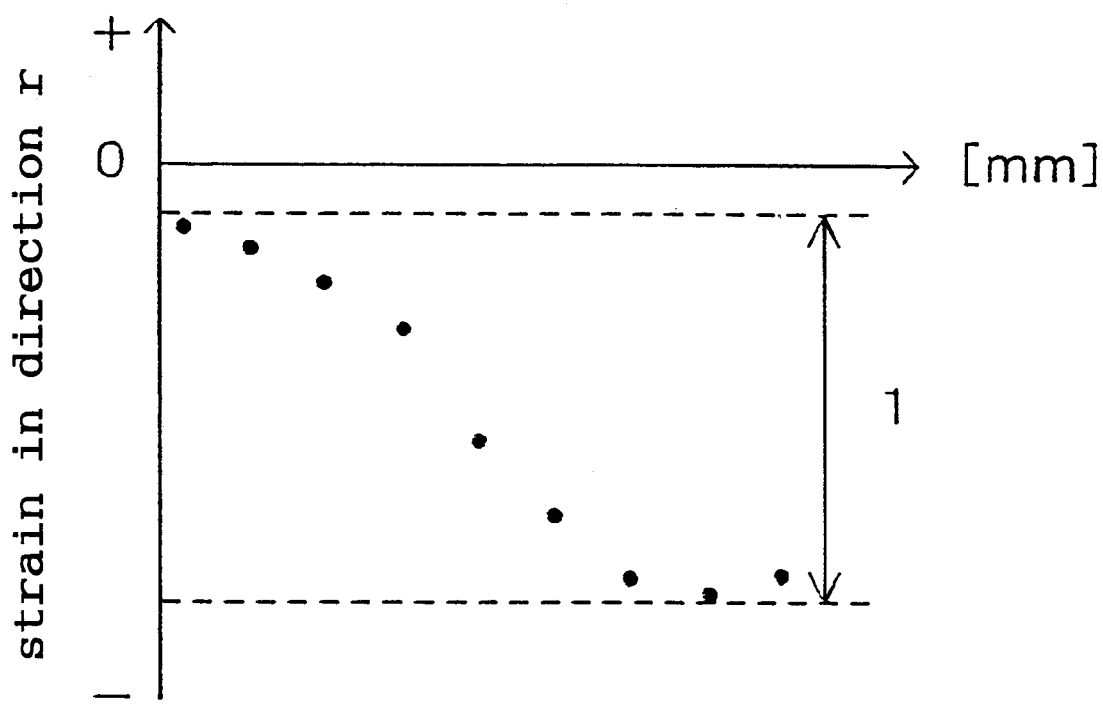
FIG. 2 is a plot diagram showing a strain distribution in a direction r inside the rod.

The values of strain in the direction r obtained by the above method are distributed as shown in FIG. 2. The difference between the maximum value and the minimum value out of the measurement values is defined as the internal strain of the rod. A value obtained by dividing the internal strain in the direction r by the radius (unit: cm) of the rod is internal strain per unit volume of the rod, that is, internal strain rate (unit: $cm^{-1}$).

The internal strain rate referred to in this invention is calculated from a strain value in the direction r. There is correlation among internal strain rates in the directions r, θ and z. For example, a rod having a large internal strain rate in the direction r has also large internal strain rates in the directions θ and z in proportion thereto. Further, the internal strain rate that is obtained the most stably out of these values is a strain rate in the direction r. Accordingly, for the calculation of the internal strain rate, the strain value in the direction r is the most suitable as a representative value. Stated more specifically, strain values in the direction r measured at least in one direction, preferably in two directions or more, toward the outer periphery from the center of the rod using strain gauges are smoothened by a three-point smoothing method, the difference between the maximum value and the minimum value among the smoothened values is obtained, and a value obtained by dividing the obtained difference value by the average value of radius (unit: cm) of the rod extending toward the outer periphery from the center thereof is taken as the internal strain rate.

Further, the polycrystal silicon rod of the present invention has also a characteristic feature in that it has an internal iron concentration of 0.5 ppba or less. That is, when the internal iron concentration of the polycrystal silicon rod is more than 0.5 ppba, the polycrystal silicon rod cannot be used as a raw material for the production of single crystal silicon any longer.

As described above, although a method of removing internal strain by annealing a polycrystal silicon rod having strain is conceivable as a general method, when the polycrystal silicon rod is taken out from a deposition reactor in order to anneal it, the surface thereof is contaminated in a moment by iron at a density of about $1 \times 10^{15}$ atoms/$cm^2$. And, the surface contamination spreads into the interior of the rod during annealing with the result of a contamination of about 7 ppba. In contrast to this, the polycrystal silicon rod of the present invention has extremely high purity with an iron concentration of 0.5 ppba or less, particularly preferably 0.1 ppba or less, by employing a special heat treatment which will be described hereinafter.

In the polycrystal silicon rod of the present invention, it is desired that the content of impurities other than iron, such as heavy metals including Cu, Ni, Cr and the like, is as small as possible. The total content of metals inclusive of iron is preferably 1 ppba or less, particularly preferably 0.5 ppba or less.

The diameter of the polycrystal silicon rod of the present invention is not particularly limited and suitably determined by the length of the rod, the size of a single crystal silicon-producing apparatus, and the like. The noticeable effect of the present invention is gained, however, when the diameter of the polycrystal silicon rod is 80 to 200 mm, particularly 120 to 200 mm.

The polycrystal silicon rod having high crystallinity, high purity and a low internal strain rate, provided by the present invention, is advantageously produced by the following process according to the present invention.

That is, the polycrystal silicon rod of the present invention can be produced by heating a silicon core material in a gaseous atmosphere comprising trichlorosilane and hydrogen to cause deposition of silicon on the silicon core material to produce a polycrystal silicon rod and subjecting the polycrystal silicon rod to a heat treatment without allowing it to contact with the air, thereby reducing strain.

Particularly, in the above process, when there is employed, as a means to reduce internal strain without bringing the polycrystal silicon rod into contact with the air, such a method that, subsequently to the deposition reaction of silicon, an electric current is applied to the polycrystal silicon rod in the presence of hydrogen or an inert gas to heat it until at least part of the surface of the polycrystal silicon rod exhibits a temperature higher than the deposition reaction temperature of silicon and a temperature of 1,030° C. or higher, and then the current is shut off to cool it, advantageously, it is possible to increase the effect of removing internal strain and greatly reduce the inclusion of impurities other than iron.

In the above process, known reactors and reaction conditions can be employed without restriction in the production of a polycrystal silicon rod by heating a silicon core material in a gaseous atmosphere comprising trichlorosilane and hydrogen to allow silicon to deposit on the silicon core material. A bell-jar is generally used as the reactor. Silicon core materials are placed in the bell-jar in such a manner that the electric current can pass through all these silicon core materials, and a mixture gas of trichlorosilane and hydrogen is fed into the bell-jar. The mixing ratio of trichlorosilane and hydrogen is generally 5 to 10, preferably 7 to 9, in terms of molar ratio. The mixture gas may be supplied after being diluted with an inert gas such as Ar, He or the like, as required.

The deposition of silicon is carried out by letting DC or AC pass through the silicon core material in a gaseous atmosphere comprising trichlorosilane and hydrogen to heat the silicon rod to 900 to 1,000° C.

However, the polycrystal silicon rod produced from trichlorosilane has large internal strain as described above.

The feature of the present invention is that a heat treatment for removing the above internal strain is carried out without allowing the polycrystal polysilicon rod produced in a reactor to contact with the air. The surface of the rod taken out from the deposition reactor is extremely active and hence, when it is heated after having been contacted with the air, extremely large quantities of metal impurities including iron present in the air are adhered to the polycrystal polysilicon rod and spread into the interior of the rod by the heat treatment, thereby contaminating the polycrystal polysilicon rod. As a result, the quality of the obtained polycrystal polysilicon rod is extremely lowered.

In the process of the present invention, means for heating the polycrystal polysilicon rod without allowing it to contact with the air is not particularly limited. The most suitable means is, as described above, to, subsequently to the reaction of silicon, let an electric current pass through the polycrystal silicon rod in the presence of hydrogen or an inert gas such as Ar, He or the like and trichlorosilane as required to heat the surface temperature of the polycrystal silicon rod to 1,030° C. or higher, preferably 1,100° C. or higher, more preferably 1,150° C. or higher, and to shut off the electric current for heating after the passage of a predetermined time. According to this process, the contamination of the rod with impurities generated from the heater can be prevented effectively because of internal heating unlike the case where a heater for external heating is used.

The above heat treatment is generally preferably carried out at a surface temperature of 1,300° C. or lower so that the interior of the polycrystal silicon can be maintained to a temperature lower than melting point to prevent danger.

The inventors of the present invention have found that only when the surface temperature of the polycrystal silicon rod was higher than the deposition reaction temperature of silicon and 1,030° C. or higher, particularly 1,100° C. or higher, the internal strain rate of the rod became small. Therefore, when the surface temperature of the rod before an electric current was shut off was lower than 1,000° C., a drop in internal strain rate was not seen and the internal strain rates of all the rods were the same.

The electric current used for heating may be either DC or AC, and a power source for the deposition of the rod can be used as it is.

The surface temperature of the polycrystal silicon rod can be increased not only by increasing an electric current value for heating but also by changing an atmosphere for heating the rod to a low thermal conductivity state. The latter case is particularly preferred since the difference in temperature between a center portion and an outer peripheral portion of the rod decreases. For example, the surface temperature can be maintained at a higher temperature in a hydrogen gas atmosphere than in a silane gas atmosphere when the current value is the same, and further the difference of thermal expansion between the center portion and the outer peripheral portion caused by the temperature difference can be reduced advantageously. While the surface temperature can be further increased by other gaseous atmosphere, a method is also employable in which heat dissipation from the surface of the rod can be suppressed to the very limit by reducing pressure, thereby making it possible to further reduce the temperature difference between the center portion and the outer peripheral portion.

The reason why an electric current is applied subsequent to the reaction of silicon is that when the current is applied to the polycrystal silicon rod again, if the temperature of the polycrystal silicon rod is too low, it is difficult to conduct the desired application of an electric current because resistance is too high, and hence, the above step is taken to eliminate such difficulty. Stated more specifically, an electric current can be not only applied immediately after production but also can be applied even after the temperature of the rod is lowered within a temperature range at which an electric current can be applied.

A method of measuring the surface temperature of the rod is not particularly limited. To measure a surface temperature as high as 1,000° C. or higher, a radiation thermometer can be advantageously used.

In the process for producing the silicon rod of the present invention, shutting-off of an electric current after heating is preferably carried out by reducing the applied current as sharply as possible in order to carry out a heat treatment effectively. A few minutes after shutting off an electric current is the substantial heat treatment time.

As a preferred embodiment to achieve the above heat treatment, there can be mentioned a method comprising applying an electric current to the polycrystal silicon rod to heat it at a temperature of 1,030° C or higher and thereafter, without reducing the current gradually, shutting off the current instantaneously to cool it. For example, in the case of a rod having a diameter of 120 mm, the current value before shutting off operation is preferably reduced to half or less within 1 minute from the start of an electric current fall. Since the larger the diameter of the rod, the larger the heat quantity the rod has and the longer time it takes to dissipate heat from the surface of the rod, an electric current falling rate is allowed to be set slightly lower.

In the present invention, the heat treatment of the polycrystal silicon rod is preferably carried out as long as possible to remove strain completely. For this purpose, a gas having as small a thermal conductivity as possible is advantageously used as the atmospheric gas.

It is generally considered that cooling rate is desirous to be lowered by reducing an electric current extremely slowly in order to shut off the current so that strain does not remain in a polycrystal silicon rod. In contrast to this, shutting off the electric current for heating sharply in the process for producing a polycrystal silicon rod of the present invention seems at first view to be against the common sense described above. However, this can be explained as follows.

Polycrystal silicon has such properties that the higher the temperature the smaller its electric resistance becomes. When deposition of polycrystal silicon is carried out by heating it with an electric current, the temperature of the surface of a rod is lowered by cooling due to heat dissipation, thereby increasing its electric resistance. Therefore, the current is apt to run in the center portion of the rod with the result that the temperature of the center portion further increases whereas the temperature of the surface of the rod decreases. As a result, the center portion of the rod is maintained at a much higher temperature than that of the outer peripheral portion.

When the current is reduced slowly, the rod is cooled in a state where the temperature difference between the interior portion and the outer peripheral portion is almost maintained. Silicon begins not to deform gradually along with cooling. When the current is further reduced and becomes null in the end and the temperature of the interior portion of the rod becomes equal to that of the outer peripheral portion, it is considered that strain based on the difference of thermal expansion between the interior portion and the outer peripheral portion remains because the thermal shrinkage amount of the interior portion of the rod differs from that of the outer peripheral portion.

On the other hand, it is considered that when an electric current is shut off sharply at a surface temperature of the rod higher than the deposition reaction temperature of silicon and 1,030° C. or higher, the temperature difference between the interior portion and the outer peripheral portion becomes small in a state where the interior portion of the rod has still a high temperature, and the temperature of the interior portion becomes almost equal to that of the outer peripheral portion. This is confirmed from the result of measurement that when an electric current is shut off, the surface temperature rises temporarily. Even when an electric current is shut off and the temperature difference between the interior portion and the outer peripheral portion becomes almost null, it is considered that if the temperature of the rod is still so high that silicon is able to deform, the rod deforms in a few minutes during which the temperature lowers though it is a short time, and residual strain is reduced.

Figure 3:
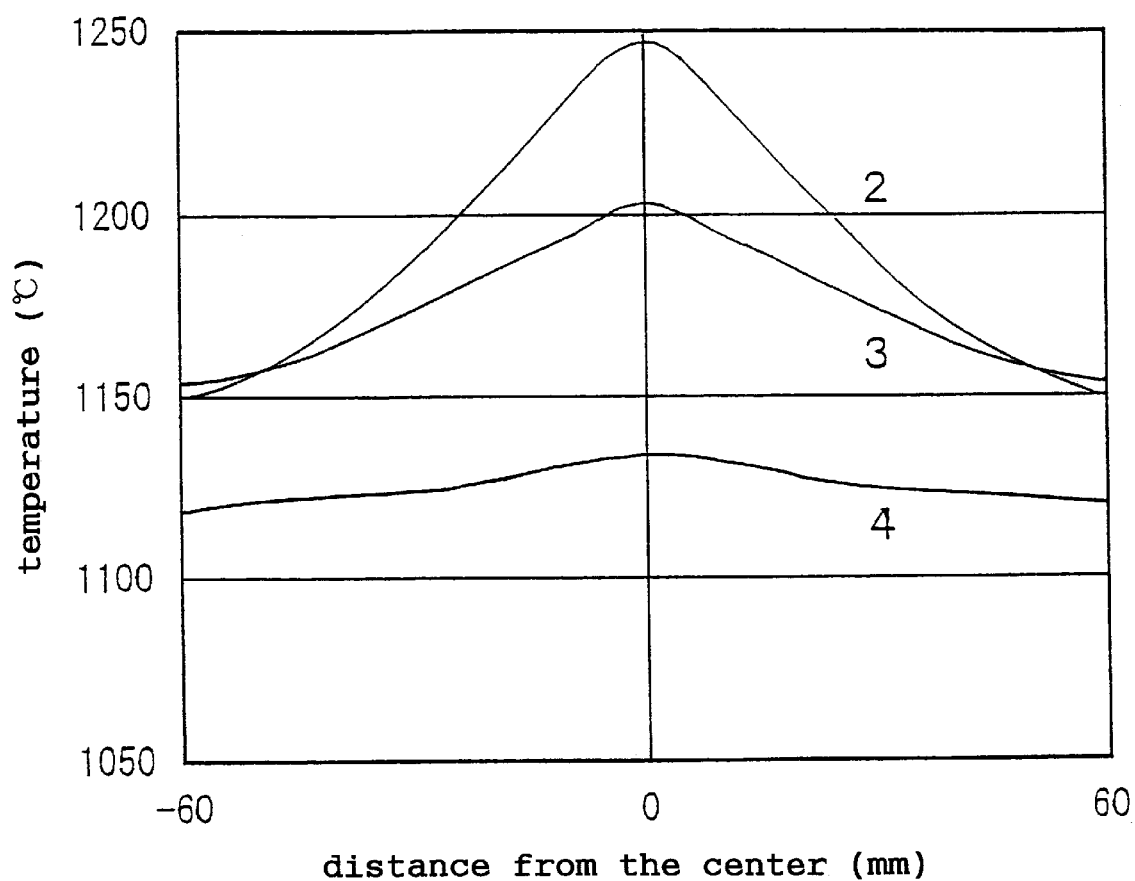
FIG. 3 shows a temperature distribution curve drawn based on calculation values for the inside of the rod during heating with an electric current and after shutting off the current.

As described above, it is considered that the strain of the rod is caused by the non-uniform temperature distribution of the inside of the rod caused by heating with an electric current. However, the temperature distribution of the inside of the rod cannot be measured directly. To prove this, the inventors of the present invention calculated the temperature distribution of the inside of the rod during heating with an electric current and after the current is shut off, from unsteady thermal conductivity calculated by a unstationary thermal performance rating. As an example of this, FIG. 3 shows changes in the temperature distribution of the inside of the rod when an electric current for heating is applied until the surface temperature of the rod reaches 1,150° C., and then shut off instantaneously. A curve 2 in the drawing is the temperature distribution curve of the inside of the rod when the surface temperature is 1,150° C. It is estimated that the temperature of the center portion of the rod is a temperature about 100° C. higher than that of the outer peripheral portion. Curves 3 and 4 are the estimated curves of the temperatures of the inside of the rod 1 minute and 5 minutes after an electric current is shut off instantaneously, respectively. It is calculated that 1 minute after an electric current is shut off, the surface temperature of the rod rises temporarily due to heat equalization and 5 minutes after, the temperatures of the center portion and the outer peripheral portion become almost equal to each other. The temperature at that time is 1,100° C. or higher. At this temperature, polycrystal silicon can deform. In other words, it is considered that, since a temperature at which the rod can deform is maintained even in a short period of time (generally 7 to 8 minutes after an electric current is shut off), the temperatures of the center portion and the outer peripheral portion become equal and at the same time, strain decreases.

The polycrystal silicon rod of the present invention has high crystallinity, high purity and extremely small internal strain. Therefore, when it is used as it is as a raw material for pulling up single crystals by FZ or recharging, stable operation is ensured and the quality of the obtained single crystal can be highly maintained.

The process for producing a polycrystal silicon rod of the present invention makes it possible to obtain the above polycrystal silicon rod very efficiently and economically.

EXAMPLES

The following Examples and Comparative Examples are given for the purpose of further illustrating the present invention specifically, but are in no way to be taken as limiting.

Example 1

After polycrystal silicon having a diameter of 120 mm was deposited by a Siemens method, the inside of a deposition reactor was substituted with a hydrogen atmosphere and an electric current value was controlled so as to maintain the surface temperature of the rod at a height of 1,000 mm from the lowest portion of the rod at 1,100° C. for 1 hour. Thereafter, the applied electric current was shut off instantaneously. The surface temperature of the rod was measured using a radiation thermometer. After cooling, the rod was taken out from the deposition reactor and strain in the direction r at a height of 1,000 mm from the lowest portion of the rod was measured using strain gauges. The rod was bored with a core drill having an inner diameter of 20 mm to measure the concentration of iron and other metals contained therein by ICP-MS and neutron activation analysis. The results are shown in Table 1. The internal strain rate of the rod is also shown in Table 1. Further, the half value width of a peak indicative of crystal orientation (111) at 2θ=about 28.5° of the X-ray diffraction pattern of the rod is also shown in Table 1.

When 1,000 rods were produced by the above method and end portions of the rods were molten under heating, cracking was observed in only one rod among the 1,000 rods.

Examples 2 and 3

Two rods were produced in the same manner as in Example 1 except that the rods had diameters of 100 mm and 140 mm, respectively. The concentrations of iron and other metals contained in the rods were measured by ICP-MS in the same manner as in Example 1. The results are shown in Table 1. The internal strain rates obtained by measuring strain in the direction r are also shown in Table 1.

When 1,000 polycrystal silicon rods were produced by the above method and end portions thereof were molten under heating, cracking was observed in none of 1,000 rods in Example 2 and one rod among the 1,000 rods in Example 3.

TABLE 1

| | Diameter (mm) | Surface temperature at shut-off of an electric current (°C.) | Internal strain rate of rod (cm$^{-1}$) | Half value width of peak (111) | Impurity metals (ppba) | | | |
|---|---|---|---|---|---|---|---|---|
| | | | | | Fe | Ni | Cr | Cu |
| Ex.1 | 120 | 1100 | 1.5 × 10$^{-5}$ | 0.16 | 0.021 | 0.014 | 0.004 | <0.2 |
| Ex.2 | 100 | 1100 | 1.6 × 10$^{-5}$ | 0.16 | <0.5 | <0.3 | <0.3 | <0.5 |
| Ex.3 | 140 | 1100 | 1.6 × 10$^{-5}$ | 0.16 | <0.5 | <0.3 | <0.3 | <0.5 |

Ex.: Example

Example 4 and Comparative Examples 1 and 2

Rods were produced in the same manner as in Example 1 except that the surface temperatures of the rods at a height of 1,000 mm from the lowest portions were maintained at 1,050° C., 900° C. and 500° C. for 1 hour, respectively. The concentrations of iron and other metals contained in the rods were measured by ICP-MS in the same manner as in Example 1. The results are shown in Table 2. The internal strain rates obtained by measuring strain in the direction r are also shown in Table 2.

In Comparative Examples 1 and 2, when the surface temperatures of the rods were reduced, temperature reduction was carried out while adjusting the temperature reduction rate so as to be 3° C./min or less.

When 1,000 polycrystal silicon rods were produced by the method of Example 4 and end portions of the rods were molten under heating, cracking was observed in 5 out of the 1,000 rods.

When 30 rods were produced by the method of Comparative Example 2 and end portions of the rods were molten under heating, cracking was observed in 19 out of the 30 rods.

Comparative Example 3

The surface temperature of a rod at a height of 1,000 mm from the lowest portion was maintained at 900° C. for 1 hour. Thereafter, an applied electric current was shut off instantaneously. After cooling, the rod was taken out from a deposition reactor, heated at 1,200° C. in an infrared heating furnace for 3 hours, and then cooled again. The rod was measured for its strain in the direction r at a height of 1,000 mm from the lowest portion. Further, the rod was bored with a core drill having an inner diameter of 20 mm, and measured for the concentration of internal iron by ICP-MS. These measurement results are shown in Table 2.

TABLE 2

| | Diameter (mm) | Surface temperature at shut-off of an electric current (°C.) | Internal strain rate of rod (cm$^{-1}$) | Half value width of peak (111) | Impurity metals (ppba) | | | |
|---|---|---|---|---|---|---|---|---|
| | | | | | Fe | Ni | Cr | Cu |
| Ex.4 | 120 | 1050 | 2.5 × 10$^{-5}$ | 0.16 | <0.5 | <0.3 | <0.3 | <0.5 |
| Comp. Ex. 1 | 120 | 900 | 8.0 × 10$^{-5}$ | 0.16 | <0.5 | <0.3 | <0.3 | <0.5 |
| Comp. Ex. 2 | 120 | 500 | 8.0 × 10$^{-5}$ | 0.16 | <0.5 | <0.3 | <0.3 | <0.5 |
| Comp. Ex.3 | 120 | 900 → Annealing | 1.5 × 10$^{-5}$ | 0.16 | 27 | 1.4 | 4.8 | <0.5 |

Ex.: Example.
Comp. Ex.: Comparative Example

We claim:

1. A polycrystal silicon rod comprising a half value width of a peak indicative of crystal orientation (111) of an X-ray diffraction pattern, of 0.3° or less, an internal strain rate in a radial direction, of less than 5.0×10$^{-5}$ cm$^{-1}$ and an internal iron concentration of 0.5 ppba or less.

2. A process for producing a polycrystal silicon rod comprising a half value width of a peak indicative of crystal orientation (111) of an X-ray diffraction pattern, of 0.3° or less, an internal strain rate in a radial direction, of less than 5.0×10$^{-5}$ cm$^{-1}$ and an internal iron concentration of 0.5 ppba or less, which comprises the steps of:

heating a silicon core material in a gaseous atmosphere comprising trichlorosilane and hydrogen to deposit silicon on the silicon core material to produce a polycrystal silicon rod, heating the polycrystal silicon rod by applying an electric current without allowing the polycrystal silicon rod to contact with air so that the surface temperature of the polycrystal silicon rod is higher than the deposition reaction temperature of silicon and is 1,030° C. or higher, and shutting off the electric current after said heating by reducing the applied current as sharply as possible, thereby reducing the internal strain rate of said polycrystal silicon rod.

3. The process of claim 2, wherein said electric current is applied to the polycrystal silicon rod in the presence of hydrogen or an inert gas to beat the polycrystal silicon rod.

* * * * *